United States Patent
Roizin et al.

(10) Patent No.: US 7,390,718 B2
(45) Date of Patent: Jun. 24, 2008

(54) SONOS EMBEDDED MEMORY WITH CVD DIELECTRIC

(75) Inventors: Yakov Roizin, Afula (IL); Zmira Shterenfeld-Lavie, Zikhron Yaakov (IL); Itzhak Edrei, Haifa (IL)

(73) Assignee: Tower Semiconductor Ltd., Ramat ( * ) Notice: Subject to any disclaimer, the term of this patent is extended or adjusted under 35 U.S.C. 154(b) by 248 days.

(21) Appl. No.: 10/783,466

(22) Filed: Feb. 20, 2004

(65) Prior Publication Data

US 2005/0186741 A1    Aug. 25, 2005

(51) Int. Cl.
*H01L 21/00*    (2006.01)
(52) U.S. Cl. .................... 438/275; 438/257
(58) Field of Classification Search ........... 438/257, 438/275
See application file for complete search history.

(56) References Cited

U.S. PATENT DOCUMENTS

| | | | |
|---|---|---|---|
| 5,963,808 A * | 10/1999 | Lu et al. ............... | 438/286 |
| 6,117,730 A | 9/2000 | Komori et al. | |
| 6,265,268 B1 | 7/2001 | Halliyal et al. | |
| 6,674,138 B1 | 1/2004 | Halliyal et al. | |
| 7,214,578 B2 * | 5/2007 | Takahashi ............. | 438/199 |
| 7,309,629 B2 * | 12/2007 | Takahashi ............. | 438/199 |
| 2003/0157758 A1 * | 8/2003 | Ohtani et al. .......... | 438/199 |
| 2005/0158954 A1 * | 7/2005 | Takahashi ............. | 438/261 |
| 2005/0186741 A1 * | 8/2005 | Roizin et al. .......... | 438/275 |
| 2007/0020848 A1 * | 1/2007 | Takahashi ............. | 438/257 |

OTHER PUBLICATIONS

Candelier et al. "High Temperature Oxide (HTO) for Non Volatile Memories Applications" *Microelectronic Engineering* 36 (1997) 87-90.

* cited by examiner

*Primary Examiner*—Laura M Schillinger
(74) *Attorney, Agent, or Firm*—Bever, Hoffman & Harms, LLP; E. Eric Hoffman

(57) ABSTRACT

An embedded semiconductor memory is fabricated by: forming diffusion bit line regions in a semiconductor substrate; then thermally oxidizing the upper surface of the substrate, thereby forming a bottom oxide layer over the substrate and simultaneously forming bit line oxide regions over each of the diffusion bit line regions; and then forming an intermediate dielectric layer (e.g., silicon nitride), over the bottom oxide layer and the bit line oxide regions. CMOS well implants are then performed in a CMOS section of the device through the silicon nitride layer and bottom oxide layer. The silicon nitride layer and bottom oxide layer are then removed in the CMOS section, and a top dielectric layer, such as a high-temperature oxide or a high-k dielectric, is deposited. The top dielectric layer completes a memory stack of the memory device, and forms a gate dielectric layer of a high voltage transistor in the CMOS section.

6 Claims, 11 Drawing Sheets

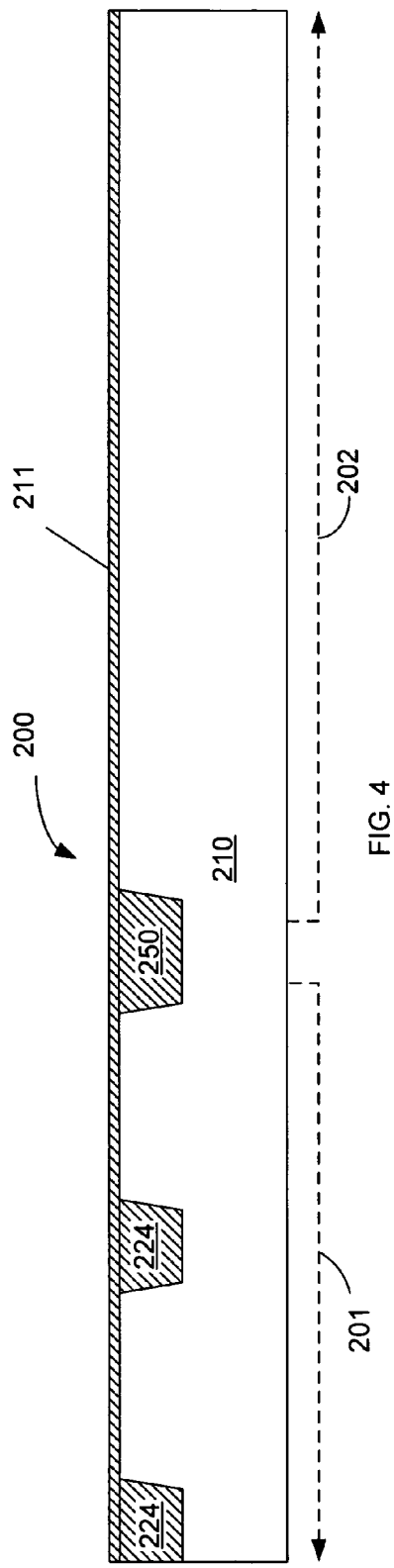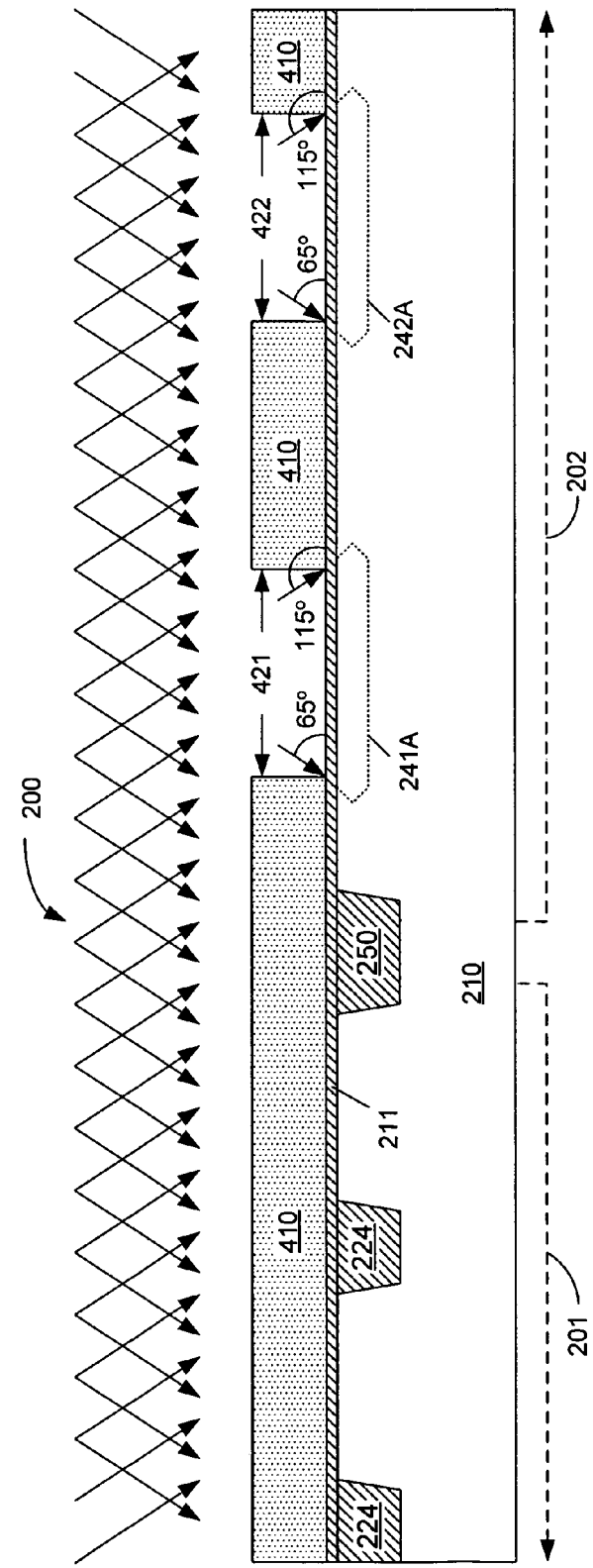

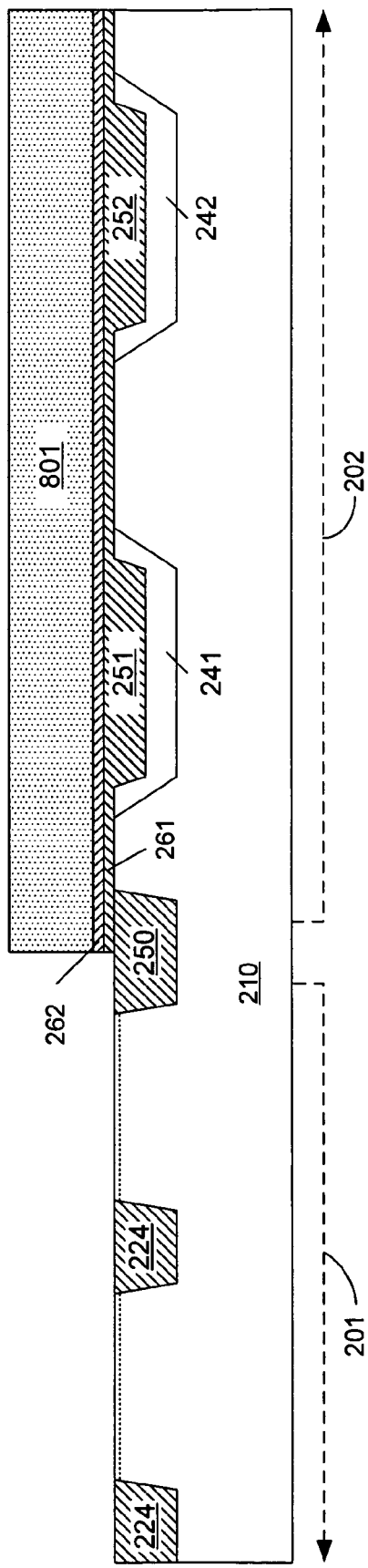
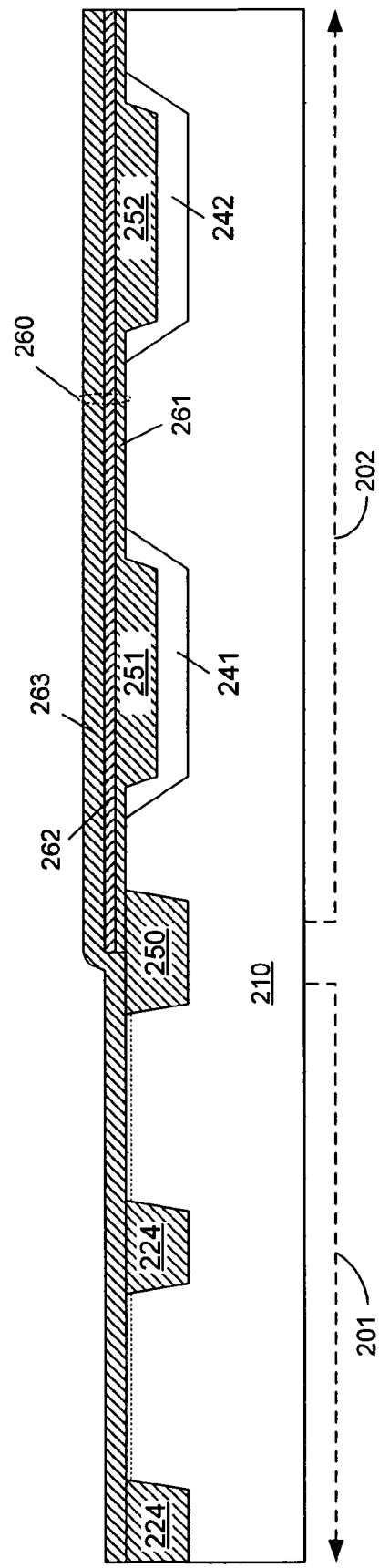
FIG. 10
FIG. 11

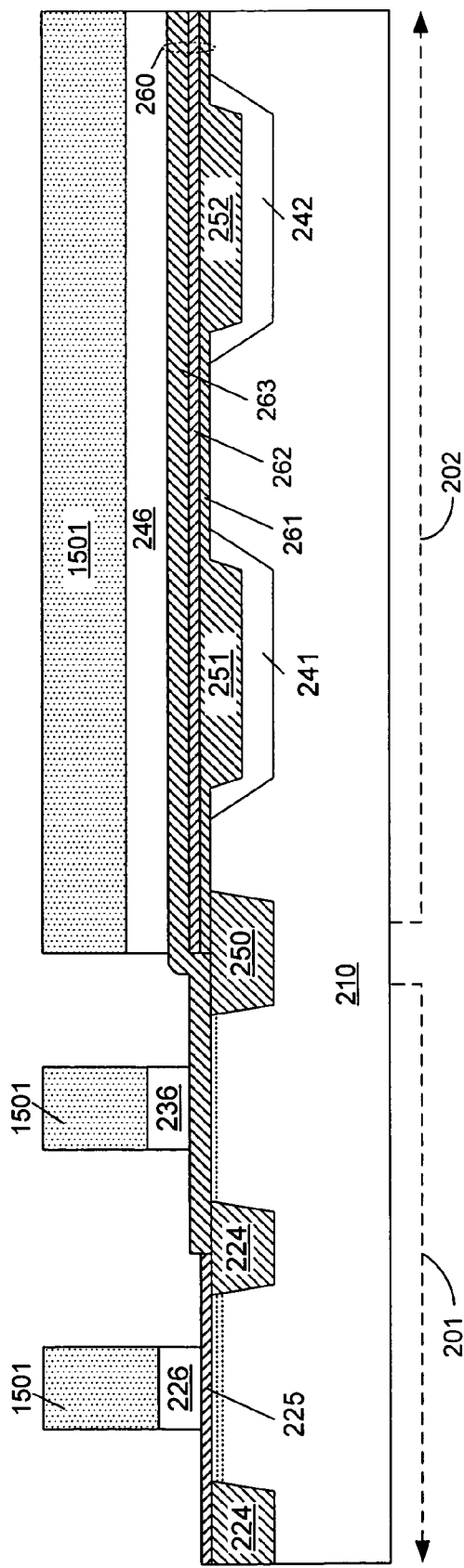
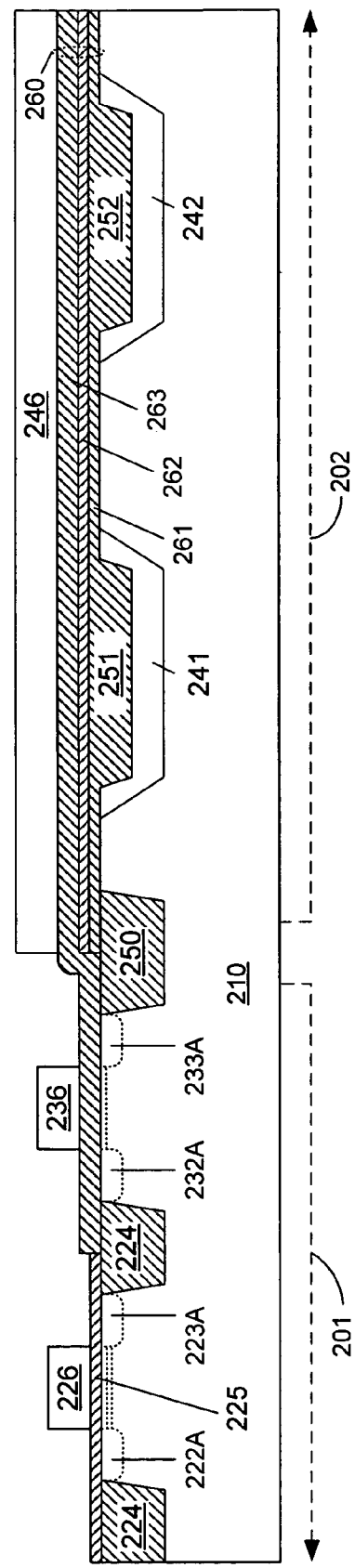
FIG. 16
FIG. 17

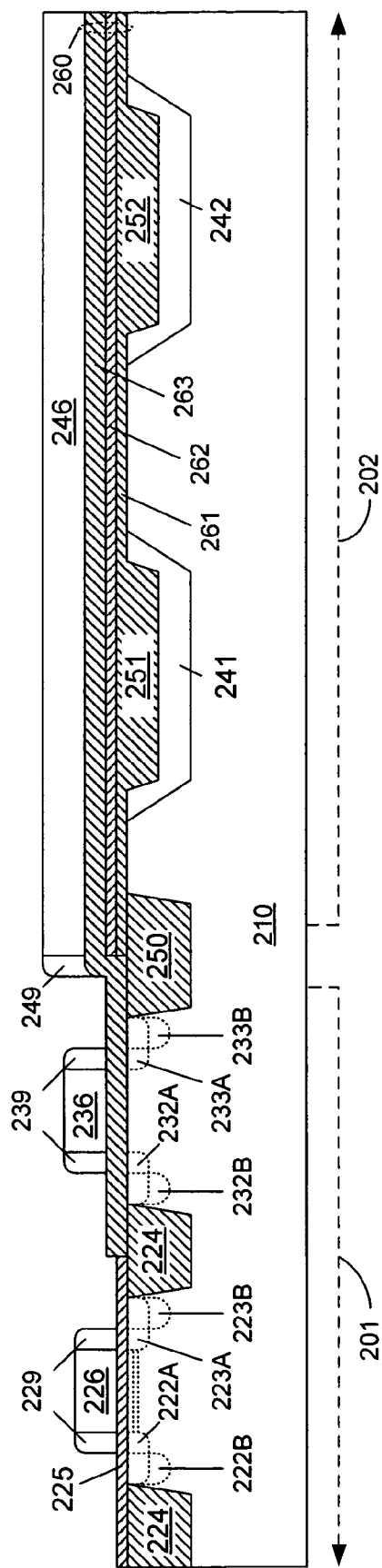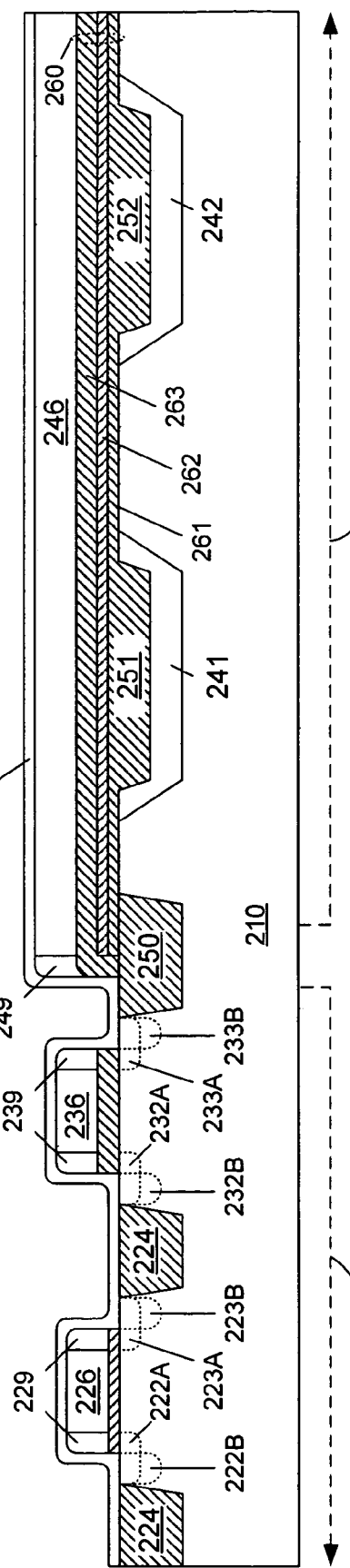

US 7,390,718 B2

SONOS EMBEDDED MEMORY WITH CVD DIELECTRIC

FIELD OF THE INVENTION

The present invention relates to the fabrication of a semiconductor device. More specifically, the present invention relates to a method of fabricating a semiconductor device that includes a first region containing CMOS logic devices and a second region containing a fieldless array of memory transistors having a silicon-oxide-nitride-oxide-silicon (SONOS) structure.

BACKGROUND OF THE INVENTION

In many memory applications, SONOS memory transistors and conventional CMOS devices are fabricated on a single semiconductor wafer. Typically, the CMOS devices are fabricated in a first region of the wafer, while the SONOS memory transistors are fabricated in a second region of the wafer. On some wafers, the SONOS memory transistors are fabricated as part of a fieldless array. A fieldless array is defined as an array that does not use field oxide or shallow trench isolation (STI) to isolate the various elements of the array. Because field oxide and/or STI is not required to isolate the SONOS memory transistors in a fieldless array, the SONOS memory transistors can be laid out with a relatively high density.

In certain applications, conventional CMOS devices (e.g., transistors) are fabricated in the second region, but do not form part of the fieldless array. That is, the CMOS devices located in the second region are isolated by field oxide. Thus, the second region can include both SONOS memory transistors and CMOS devices.

In order to distinguish the above-described transistors, the following nomenclature will be used. As used herein, the term "fieldless array transistor" refers to a floating gate SONOS type non-volatile memory transistor that is used to form a fieldless array. A fieldless array transistor does not require field oxide or STI isolation. Each fieldless array transistor can store one bit or multiple bits in a manner known to those of ordinary skill.

As used herein, the term "logic transistor" refers to a transistor fabricated in accordance with conventional CMOS processes, regardless of whether the transistor is fabricated in the first region or the second region of the semiconductor wafer. A CMOS logic transistor is isolated from other elements by field oxide or STI. CMOS logic transistors can further be classified as low voltage (e.g., 1.8 Volt) CMOS logic transistors, medium voltage (e.g., 3.3 Volt) CMOS logic transistors and high voltage (e.g., 8-10 Volt) CMOS logic transistors, in view of the operating voltages applied to the logic transistors. Note that the high voltage CMOS logic transistors are required to access the fieldless array transistors. Thus, a high-voltage oxide (e.g., 150-200 Angstroms) must be fabricated in the first region in addition to low voltage oxide (e.g, about 30 Angstroms) and medium voltage oxide (e.g., about 70 Angstroms). The higher the voltage to be handled by the CMOS logic transistor, the thicker the required gate oxide of the transistor, thereby enabling the transistor to withstand higher gate voltages.

The process steps required to fabricate high, medium and low voltage CMOS logic transistors are not fully compatible with the process steps required to fabricate fieldless array transistors. For example, if thermal oxidation is used for fabrication of the high-voltage oxide, additional thermal budget is required. In addition, thermal oxidation of the high-voltage oxide will influence the shape of shallow trench isolation (STI) divots, and can enhance mechanical stresses in silicon. As a result, transistor and diode leakage currents will typically increase.

It would therefore be desirable to have an improved process for fabricating high, medium and low voltage CMOS logic transistors and fieldless array transistors on the same wafer.

FIG. 1 is a cross-sectional view of a conventional SONOS fieldless array transistor 100. Fieldless array transistor 100 includes p-type semiconductor substrate 101, N-type source/drain regions 102-103, oxide-nitride-oxide (ONO): memory stack 110, bit line oxide 114 and polysilicon gate electrode/word line 115. ONO memory stack 110 includes bottom silicon oxide layer 111, silicon nitride layer 112 and top silicon oxide layer 113. Source/drain regions 102-103 extend to other memory transistors, and operate as diffusion bit lines.

Bit line oxide 114, which provides isolation between the diffusion bit lines, is implemented by oxidizing the heavily implanted source/drain regions 102-103 between the patterned ONO stack 110. The isolating bit line oxide 114 is similar to LOCOS oxide. The thickness of bit line oxide 114 must be large enough to ensure no leakage between gate electrode/word line 115 and source/drain regions 102-103. Bit line oxide 114 typically has a thickness (T) of 500 to 1000 Angstroms to compensate for the relatively low quality of bit line oxide grown over N+ source/drain regions 102-103 (compared with the relatively high quality gate oxide of the same thickness grown over a p- substrate).

Fieldless array transistor 100 may exhibit low reliability because of problems associated with electrical weakness of ONO memory stack 110 at the locations where ONO memory stack 110 joins bit line oxide 114 (i.e., at the bit line oxide "oxybeaks".) The oxybeak regions are labeled "OB" in FIG. 1. Bit line oxide consumption and influence on the edges of the top oxide layer 113 of ONO stack 110 during resist removal operations are strongly pronounced in embedded process flows. This results in poor dielectric performance in the oxybeak region and directly influences the reliability of the resulting memory device.

High-temperature CVD oxide has been used to form the top oxide layer of an ONO memory stack of a fieldless array transistor, thereby lowering the leakage of the ONO memory stack. (See, U.S. Pat. No. 6,265,268.) High-temperature oxide has also been used instead of an ONO memory stack to form an inter-polysilicon dielectric in EEPROM memory, and at the same time, form a thermal gate oxide in peripheral transistors used in the decoding logic of the EEPROM. (Candelier et al., "High Temperature Oxide (HTO) For Non-Volatile Memory Applications", Microelectronic Engineering, Vol. 36, 1997, pp. 87-90; SGS Thompson-LETI.)

High-temperature oxide has also been used as the top oxide layer of an ONO memory stack, and as the gate oxide of high voltage periphery transistor. (See, U.S. Pat. No. 6,117,730) In this case, the bit line oxide is formed after the source/drain regions have been implanted, and after the silicon nitride layer of the ONO stack has been formed. Bit line oxide is consumed during bit line mask resist removal and during periphery strip mask resist removal. This consumption of the bit line oxide can result in a stressed oxybeak region. As a result, the charge-to-breakdown (Qbd) values of the fieldless array transistors are low even with the high temperature top oxide layer.

It would therefore be desirable to have an improved and cost effective integration scheme for embedding SONOS type multi-bit fieldless array transistors and high voltage logic transistors into the standard CMOS process flow.

SUMMARY

The present invention relates to an improved method of fabricating an embedded semiconductor memory device that includes both a SONOS fieldless memory array and CMOS devices. The SONOS memory array includes an oxide-nitride-oxide (ONO) memory stack, which has a bottom oxide layer, a silicon nitride layer and a top oxide layer.

The embedded semiconductor-memory device is fabricated in the following manner. Shallow trench isolation regions are typically fabricated in the CMOS region of the device. Diffusion bit line regions are then formed in the fieldless array region of the semiconductor substrate. The upper surface of the substrate is then thermally oxidized, thereby forming the bottom oxide layer over the substrate and simultaneously forming bit line oxide regions over each of the diffusion bit line regions. The bit line oxide regions, which are more heavily doped than the other regions of the substrate, enable the bit line oxide regions to grow at a faster rate than the bottom oxide layer. For example, the bit line oxide regions may grow 2 to 3 times faster than the bottom oxide layer. In one embodiment, the bottom oxide layer has a thickness of about 50 Angstroms, and the bit line oxide regions have a thickness of about 100 to 150 Angstroms. This is significantly thinner than conventional bit line oxide regions.

The silicon nitride layer is then formed over the bottom oxide layer and the bit line oxide regions. CMOS well implants are then performed in a CMOS region of the device through the silicon nitride layer and bottom oxide layer. The silicon nitride layer and bottom oxide layer are then removed in the CMOS region, and the top oxide layer is deposited over the resulting structure. The top oxide layer can be formed by a high-temperature, chemical vapor deposition (CVD) process. The top oxide layer completes the ONO memory stack of the memory device, and also forms a gate dielectric layer of the high voltage transistors in the CMOS region. Low and medium voltage transistors can also be formed in the CMOS-region using conventional CMOS processing techniques.

The present invention will be more fully understood in view of the following description and drawings.

BRIEF DESCRIPTION OF THE DRAWINGS

FIGS. 4 through 19 are cross sectional views of the semiconductor device of FIG. 2, during various stages of fabrication, in accordance with one embodiment of the present invention.

DETAILED DESCRIPTION

In accordance with the present invention, the top oxide layer of an ONO memory stack and the gate oxide of a high voltage logic transistor are formed by depositing a high temperature CVD oxide. The high temperature CVD oxide eliminates the requirement of thermally growing high-voltage gate oxide for the high voltage logic transistors. Because the high-voltage gate oxide is not thermally grown, the critical influence of a high-temperature thermal oxidation on shallow trench isolation regions of the device is eliminated. Eliminating the thermal growth of the high voltage gate oxide also decreases the number of operations and masks in the process flow, because there is no need for additional masking of the bit line oxide during the CMOS oxide fabrication. In addition, the silicon nitride layer of the ONO stack serves as protection against bit line oxide loss during the CMOS part processing.

Figure 1:
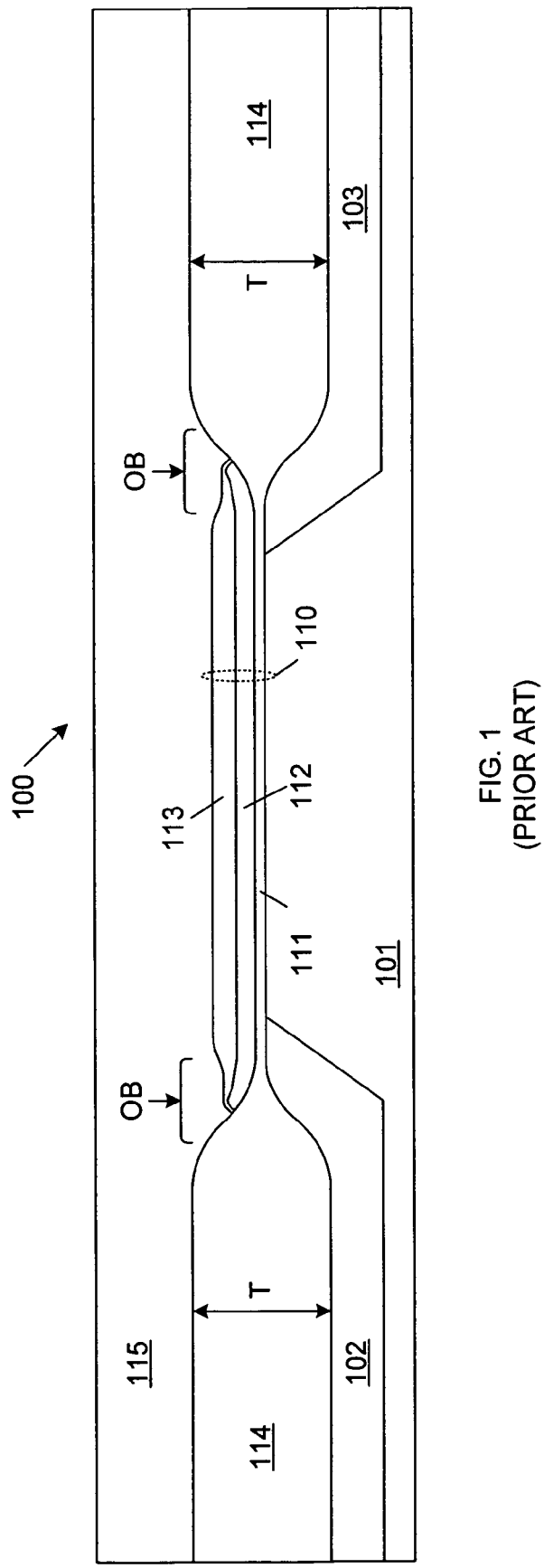
FIG. 1 is a cross-sectional view of a conventional fieldless array transistor.

The present invention provides a reliable oxybeak region in a process that uses high-temperature CVD oxide. The high temperature CVD top oxide is deposited over the nitride layer (which in turn is deposited over the bottom oxide/thin bit line layer), thereby improving the dielectric properties of the oxybeak region by forming a bit line oxide-nitride-high temperature oxide stack, and by avoiding the effect of top oxide edge etch shown in FIG. 1. The high temperature oxide reduces the charge leakage associated with the top oxide layer. Thus, a higher charge-to-breakdown (Qbd) is achieved in the fieldless array transistors.

Figure 2:
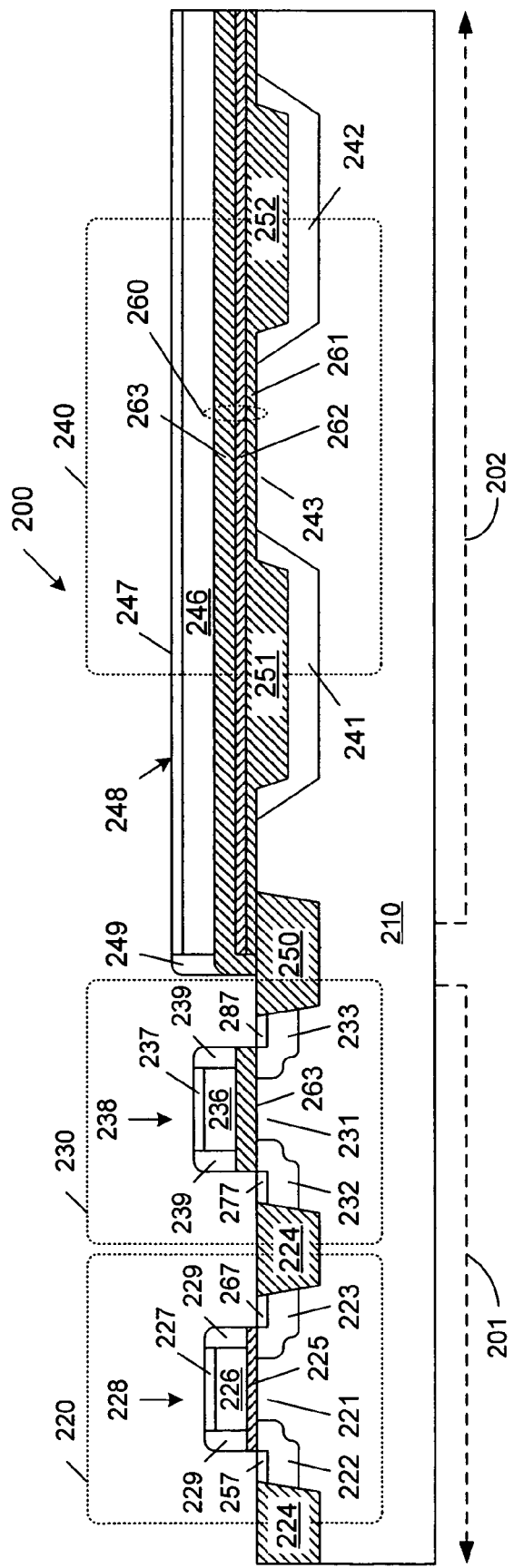
FIG. 2 is a cross sectional view of a semiconductor device, having a fieldless array region and a CMOS region, that is fabricated in accordance with one embodiment of the present invention.

FIG. 2 is a cross sectional view of a semiconductor device 200 that is fabricated in accordance with one embodiment of the present invention. Semiconductor device 200 is divided into a first region 201 and a second region 202. First region 201 and second region 202 are separated by border shallow trench isolation (STI) region 250. Conventional CMOS devices are fabricated in first region 201, while a fieldless array of transistors is fabricated in second region 202. In addition to the fieldless array, CMOS devices (not shown) may also fabricated in second region 202. The various elements of semiconductor device 200 are not shown to scale.

Semiconductor device 200 includes n-channel field effect transistors 220 and 230 fabricated in the first region 201 of semiconductor substrate 210. In the described embodiment, transistor 220 is a medium voltage CMOS logic transistor, and transistor 230 is a high voltage CMOS logic transistor. It is understood that first region 201 will typically include many other CMOS devices, including low voltage CMOS logic transistors.

Semiconductor device 200 also includes a floating gate type n-channel field effect transistor 240 fabricated in second region 202 of semiconductor substrate 210. In the described embodiment, transistor 240 is a fieldless array transistor, which is used as a single-bit or multi-bit non-volatile memory cell in a manner known to those of ordinary skill in the art.

Medium voltage logic transistor 220 includes N+type source and drain regions 222 and 223, P-type channel region 221, gate oxide layer 225, conductively doped polycrystalline silicon (polysilicon) gate 226, metal salicide layer 227 and electrically insulating sidewall spacers 229. Together, poly-silicon gate 226 and metal salicide layer 227 form a polycide control gate 228 for logic transistor 220. Metal salicide regions 257 and 267 provide contacts to source/drain regions 222 and 223, respectively.

High voltage logic transistor 230 includes N+ type source and drain regions 232 and 233, P-type channel region 231, gate oxide layer 235 (which is a high-temperature CVD oxide), conductively doped polysilicon gate 236, metal salicide layer 237 and electrically insulating sidewall spacers 239. Together, polysilicon gate 236 and metal salicide layer 237 form a polycide control gate 238 for logic transistor 230. Metal salicide regions 277 and 287 provide contacts to source/drain regions 232 and 233, respectively.

Fieldless array transistor 240 includes a P-type channel region 243 and N+type diffusion bit lines 241 and 242, which act as the source/drain regions of fieldless array transistor 240. Bit line oxide regions 251 and 252 are located over buried diffusion bit lines 241 and 242, respectively. Portions of diffusion bit lines 241 and 242 extend laterally beyond the edges of bit line oxide regions 251 and 252. Fieldless array transistor 240 also includes a floating gate (ONO) structure 260 formed from bottom silicon oxide layer 261, intermediate dielectric layer 262, and top dielectric layer 263. In the described embodiment, intermediate dielectric layer 262 is silicon nitride. However, other dielectric materials can be used in other embodiments. In the described embodiment, top dielectric layer 263 is formed of high-temperature CVD silicon oxide. In other embodiments, top dielectric layer 263 can be formed of other deposited dielectric materials having a high dielectric constant (i.e., greater than 3.9). Floating gate structure 260 is sometimes referred to as an ONO structure because of the oxide-nitride-oxide layering of the structure.

The proposed integration scheme has an additional advantage compared with the prior art because the bit line reactive ion etch is a complicated process when the ONO structure includes high-dielectric materials. In the described embodiment, the ONO structure is continuous over the entire fieldless array region 202 because the intermediate dielectric layer 262 and the top dielectric layer 262 are deposited after bit line formation.

A conductively doped polysilicon section 246 overlies bit line oxide regions 251-252 and floating gate structure 260. A metal salicide layer section overlies polysilicon section 246. Metal salicide section 247 and polysilicon section 246 collectively form a polycide control gate/wordline 248 of fieldless array transistor 240. Dielectric sidewall spacer 249 is located adjacent to polycide control gate 248. Bit line oxide regions 251 and 252 isolate buried diffusion bit lines 241 and 242 from polycide control gate 248.

In the described embodiment, fieldless array transistor 240 is connected to a plurality of other fieldless array transistors to form a fieldless array. The fieldless array transistors share control gates and diffusion bit lines in a manner that is described below.

Figure 3:
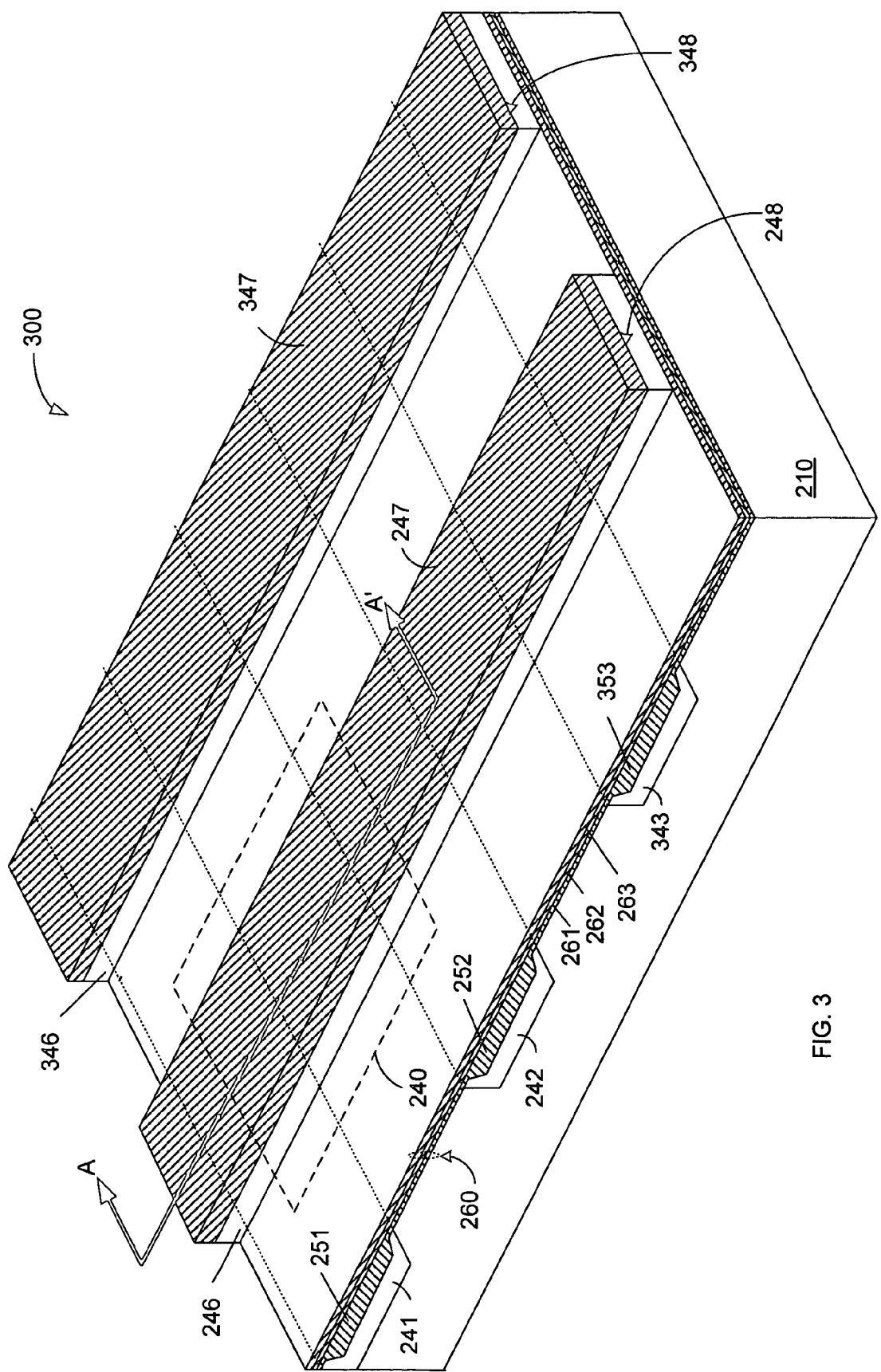
FIG. 3 is an isometric view of a portion of the fieldless region of the semiconductor device of FIG. 2.

FIG. 3 is an isometric view of a portion of the fieldless array 300 that is fabricated in second region 202. Fieldless array transistor 240 is identified by dashed lines in FIG. 3. The cross sectional view of fieldless array 300 illustrated in FIG. 2 is taken along section line A-A' of FIG. 3.

Fieldless array 300 includes a plurality of diffusion bit lines (source/drain regions) 241, 242 and 343 that extend in parallel along a first axis (as shown by the dashed lines extending from the source/drain regions). Each of diffusion bit lines 241, 242 and 343 is substantially covered by a corresponding bit line oxide layer 251, 252 and 353, respectively. ONO structure 260, which includes bottom oxide layer 261, silicon nitride layer 262 and top oxide layer 263, extends over substrate 210 as illustrated. As described in more detail below, top oxide layer 263 and silicon nitride layer 262 may be removed in the areas between the polycide control gates in an alternate embodiment. Polycide control gates (i.e., word lines) 248 and 348 extend in parallel along a second axis that is perpendicular to the first axis. Polycide control gate 248 was described above. Polycide control gate 348 includes conductively doped polysilicon section 346 and metal salicide section 347.

As explained above, diffusion bit lines 241 and 242 form the source/drain regions of fieldless array transistor 240. However, diffusion bit lines 241 and 242 also form the source/drain regions of an adjacent transistor that includes polycide control gate 348 and ONO structure 260. Thus, the sources/drain regions of the fieldless array transistors extend laterally beyond the gates of these transistors. Furthermore, diffusion bit line 242 also forms the source in another adjacent transistor which includes polycide control gate 248, ONO structure 260 and diffusion bit line 343 (which forms a source/drain region of this adjacent transistor). The operation of fieldless array 300 is described in more detail in commonly owned U.S. Pat. No. 6,256,231, by Yoav Lavi and Ishai Nachumovsky, entitled "EEPROM ARRAY USING 2-BIT NON-VOLATILE MEMORY CELLS AND METHOD OF IMPLEMENTING SAME", commonly owned U.S. Pat. No. 6,181,597, by Ishai Nachumovsky, entitled "EEPROM ARRAY USING 2-BIT NON-VOLATILE MEMORY CELLS WITH SERIAL READ OPERATIONS", and commonly owned U.S. Pat. No. 6,081,456, by Oleg Dadashev, entitled, "BIT LINE CONTROL CIRCUIT FOR A MEMORY ARRAY USING 2-BIT NON-VOLATILE MEMORY CELLS".

FIGS. 4-19 illustrate process steps used to form semiconductor device 100 in accordance with one embodiment of the present invention. The described process is a twin-well process. Initially the high voltage n-wells are formed within substrate 210, followed by the low voltage n-wells and the p-wells. These well regions are not illustrated in the Figures for purposes of clarity. However, it is understood that thefieldless array is fabricated in a p-well, and that n-channel CMOS logic transistors 220 and 230 are fabricated in a p-well. (P-channel devices are fabricated in the n-wells.)

As illustrated in FIG. 4, the required shallow trench isolation (STI) regions are then formed. The illustrated STI regions include border STI region 250 and CMOS STI regions 224. The STI regions are formed in accordance with conventional CMOS processing techniques to a thickness in the range of about 2500 to 5000 Å. After the STI regions are formed, a sacrificial oxide layer 211 is formed over the upper surface of substrate 210. In the described embodiment, sacrificial oxide layer 211 has a thickness of about 130 Angstroms (although other thicknesses are possible). Threshold voltage implants may be performed through the sacrificial oxide layer 211.

A layer of photoresist is then deposited over the upper surface of semiconductor device 200. This photoresist layer is exposed and developed to create a photoresist mask 410 having openings 421 and 422, as illustrated in FIG. 5. Openings 421 and 422 are located to define the diffusion bit lines of fieldless array 300. More specifically, openings 421 and 422 define the locations of diffusion bit lines 241 and 242, respectively. High angle implants are then performed through openings 421 and 422. More specifically, a P-type impurity, such as boron, is implanted through openings 421 and 422 at acute and obtuse angles with respect to the surface of semiconductor substrate 210, such that the dopant extends under the edges of photoresist mask 410. The implanted boron serves to adjust the threshold voltages and to increase the drain fields of the fieldless array transistors. The implanted p-type impurities are illustrated as dashed regions 241A and 242A in FIG. 5.

In an alternative embodiment, an additional counter doping implant can be implemented. The counter doping implant is performed by implanting an n-type impurity, such as phosphor, using parameters similar to the above-described high angle implants. The n-type impurity provides improved junction edge optimization. In yet another embodiment, counter doping is achieved by performing a blanket low energy implant of an n-type impurity over the entire array, prior to the formation of photoresist mask 410.

Figure 6:
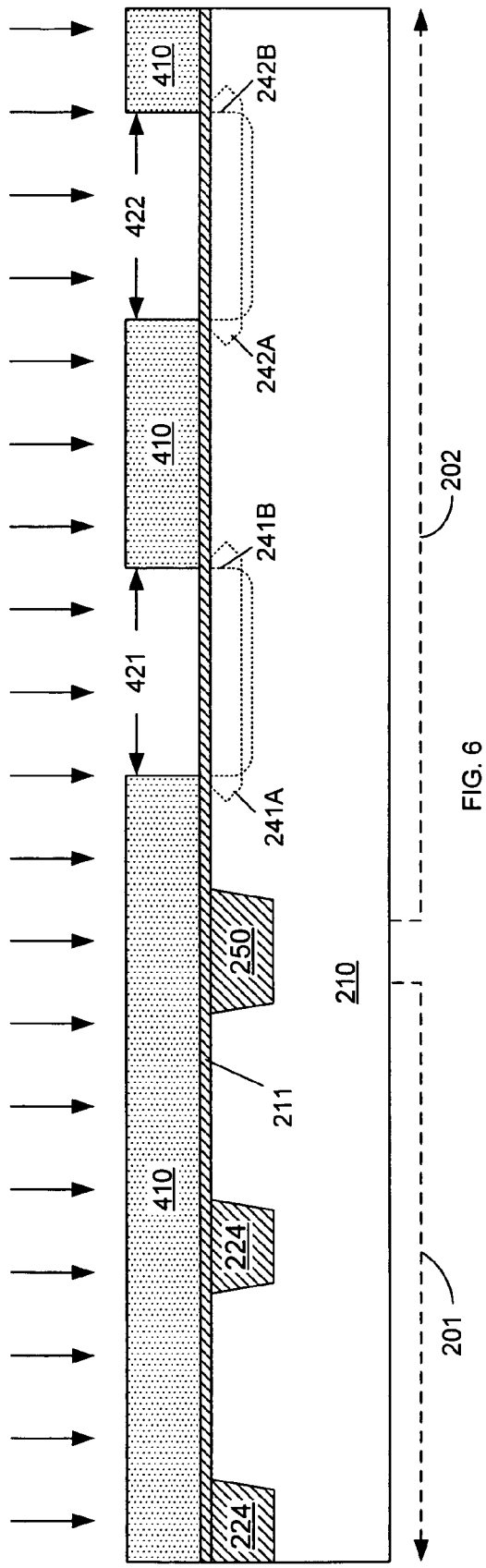
Figure 7:
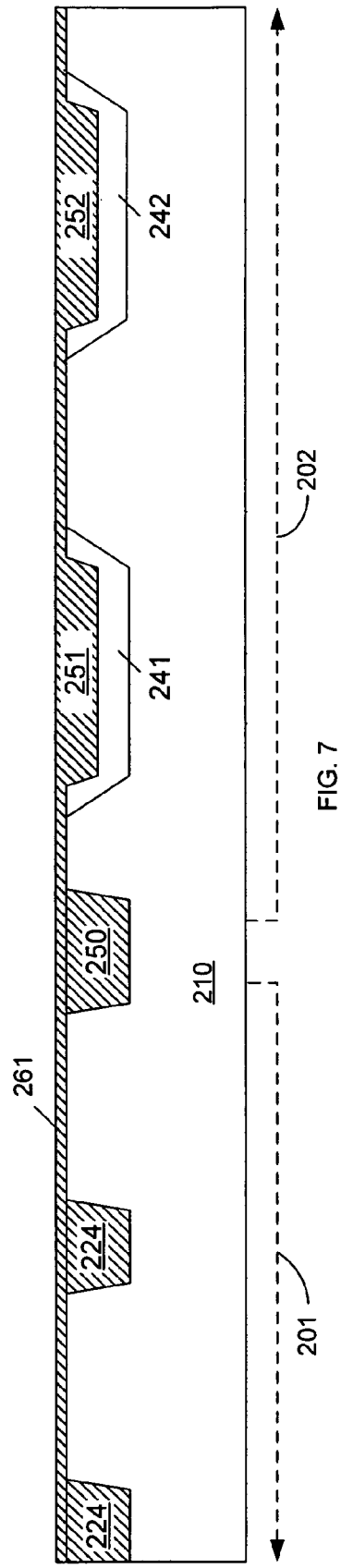

As illustrated in FIG. 6, an N-type impurity, such as arsenic, is then implanted through openings 421 and 422 of photoresist mask 410. In one embodiment, arsenic is implanted with a dopant density in the range of 1.5E15 to 2.5E15 ions/cm$^2$ and an implantation energy in the range of about 20 to 40 KeV. In a particular embodiment, arsenic is implanted with a dopant density of about 2E15 ions/cm$^2$ and an implantation energy of about 30 KeV. The implanted N-type impurities are illustrated as dashed regions 241B and 242B in FIG. 6. A dummy thermal cycle (in inert gas) is optional at this stage for tuning the drain doping profiles of the fieldless array transistors.

Photoresist mask 410 is then stripped, and a thermal oxidation step is performed, thereby simultaneously creating bottom oxide layer 261 and bit line oxide regions 251-252. (FIG. 7) In one embodiment, bottom oxide layer 261 and bit line oxide regions 251-252 are thermally grown using a wet oxidation process at a temperature in the range of 750 to 850° C., until bottom oxide layer has a thickness of about 50 Angstroms, and bit line oxide regions 251-252 have a thickness of about 100 to 150 Angstroms. This oxidation step also activates and diffuses the implanted impurities in regions 241A-241B and 242A-242B, thereby forming diffusion bit lines 241 and 242. (Subsequent high temperature processing steps complete the activation of the implanted impurities in regions 241A-241B and 242A-242B). Note that the relatively low temperature of 800° C. results in very slow oxidation of silicon. This slow oxidation rate makes it easy to control the thickness of the resulting oxide regions.

Also note that the bit line oxide regions 251 and 252 are not specially fabricated. That is, bit line oxide regions 251 and 252 grow at the same time as bottom oxide layer 261. The oxidation rate of silicon strongly doped with arsenic (e.g., source/drain regions 241-242) is about 2-3 times higher than the oxidation rate of p-type silicon (e.g., channel region 243). Thus a bottom oxide layer 261 having a thickness of about 50 Angstroms corresponds to a bit line oxide having a thickness of about 100 to 150 Angstroms. This is advantageous because lower mechanical stresses are expected for thinner bit line oxides. The surface of the fieldless array 300 has a much less aggressive topology (practically flat) than the surface of conventional fieldless arrays (e.g., FIG. 1). The bottom oxide layer 261 can be made thinner than the bottom oxide layer of standard fieldless arrays because this bottom oxide layer 261 is part of a stacked dielectric, as described in more detail below.

Figure 8:
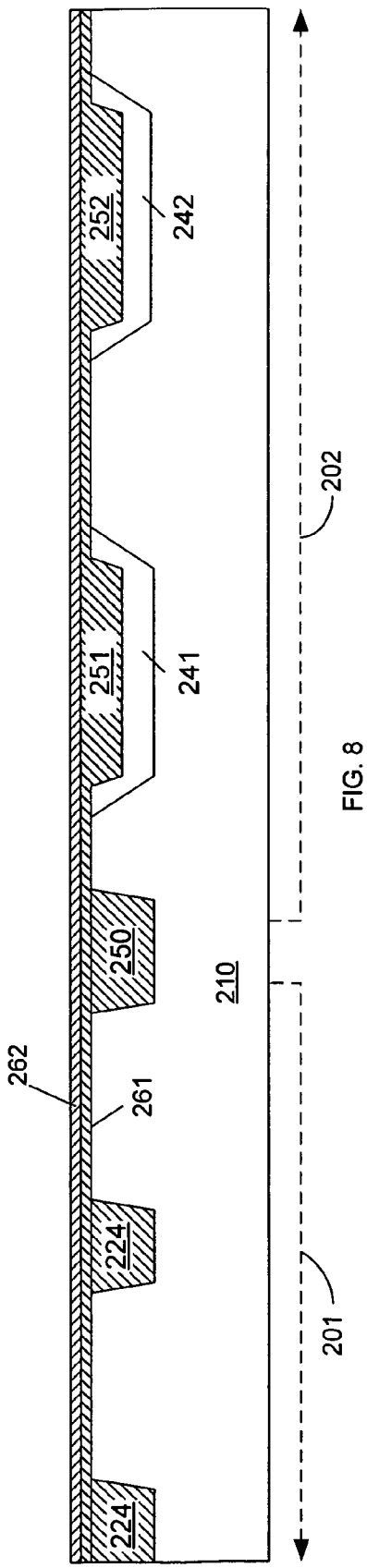

As shown in FIG. 8, a silicon nitride layer 262 is deposited over bottom oxide layer 261 and bit line oxide regions 251-252. In the described embodiment, silicon nitride layer 262 has a thickness in the range of about 40 to 80 Angstroms. In a particular embodiment, silicon nitride layer 262 has a thickness of about 70 Angstroms. The process for depositing silicon nitride is well known to those of ordinary skill in the art. Silicon nitride layer 262 advantageously inhibits additional growth of bit line oxide regions 251-252 during subsequent processing steps.

Figure 9:
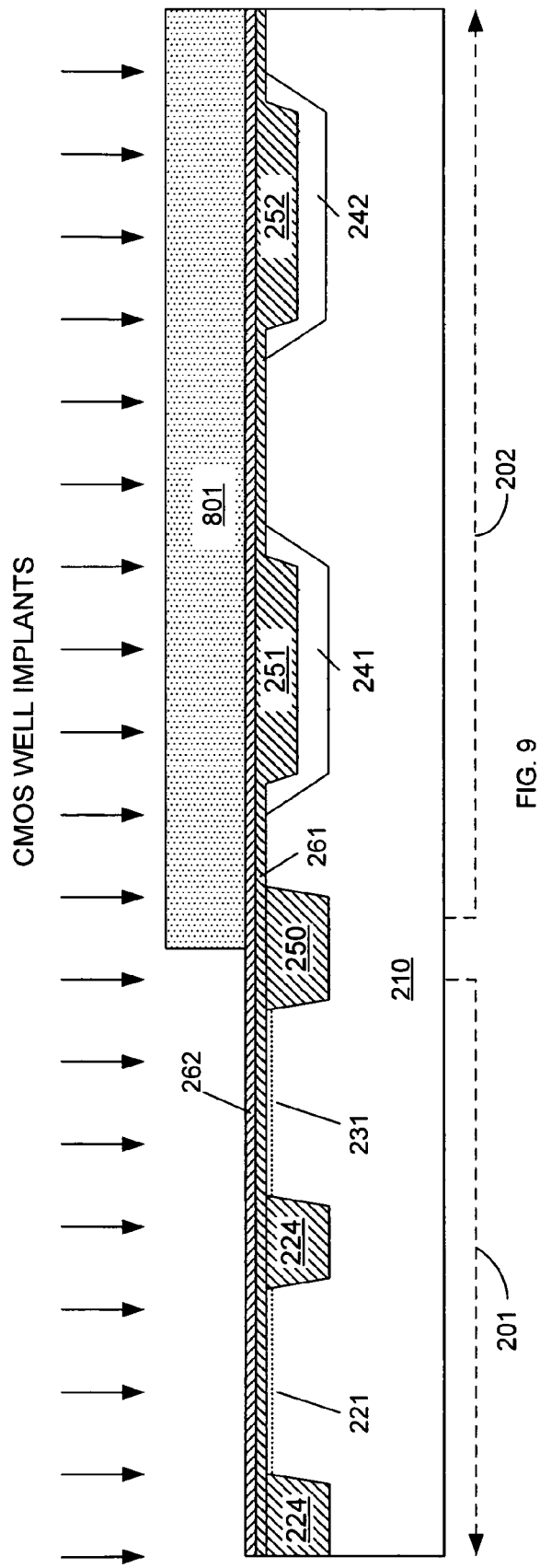

Another layer of photoresist material is then deposited over the upper surface of the resulting structure. This photoresist layer is exposed and developed to form photoresist mask 801. (FIG. 9) As illustrated in FIG. 9, photoresist mask 801 exposes first region 201 and covers second region 202 (CMOS strip mask). It is noted that specific zones in second region 202 might also be exposed at this time, thereby allowing logic transistors to be fabricated in second region 202 in the manner suggested above. An implant to adjust the threshold voltages of the high voltage CMOS logic transistors is then performed through silicon nitride layer 262 and bottom oxide layer 261. In the described embodiment, this high voltage threshold implant is performed by implanting a P-type impurity, such as boron, to adjust the threshold voltage of the high voltage transistors. The high voltage threshold implant is shown as dashed lines in channel regions 221 and 231.

As illustrated in FIG. 10, a series of etches are then performed to remove the portions of silicon nitride layer 262 and lower silicon oxide layer 261 exposed by photoresist mask 801. A thin sacrificial oxide layer may be thermally grown at this point.

As shown in FIG. 11, photoresist mask 801 is stripped and a high-temperature oxide is CVD deposited over the surface of the resulting structure, thereby forming top oxide layer 263. In a particular embodiment, top oxide layer 263 is formed using dichlorsilane/$N_2O$ in a ratio of 1:4, at a temperature of 800° C., a pressure of 350 mTorr and a deposition time of 10 minutes. The oxidation steps performed before the deposition of top oxide layer 263 are carried out at relatively low temperatures (e.g., 750° C. wet oxidation, 800° C. dry oxidation), thereby supporting a low thermal budget. The low thermal budget suppresses drive-in of the retrograde p-well of the fieldless array transistors. The oxidation steps performed before the deposition of top oxide layer 263 also improve the charge retention properties of silicon nitride layer 262, as these oxidation steps form a thin oxynitride layer at the surface of silicon nitride layer 262.

In the described embodiment, top oxide layer 263 has a thickness of about 140 to 150 Angstroms. Other thicknesses are possible in other embodiments. Note that bottom oxide layer 261, silicon nitride layer 262 and top oxide layer 263 form ONO structure 260.

Use of a CVD deposited dielectric to implement top oxide layer 263 advantageously allows scaling of the thickness of this layer 263, and thus, scaling of the large drive currents of high voltage logic transistors, and scaling of the large breakdown voltages of the high voltage logic transistors. Scaling of the thickness of top oxide layer 263 also enables suppressing parasitic electron injection from the polysilicon section 248 into the silicon nitride layer 262 during operation of fieldless array transistor 240.

Figure 12:
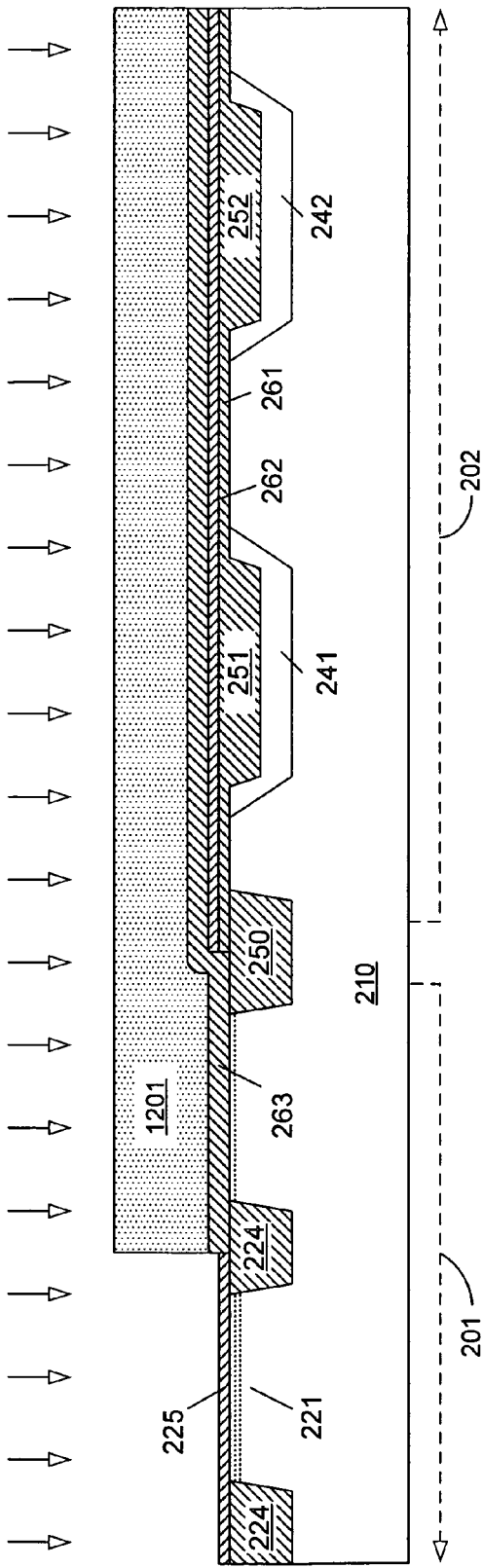

As illustrated in FIG. 12, a layer of photoresist is deposited over the surface of the resulting structure. This photoresist layer is exposed and developed to create photoresist mask 1201. Photoresist mask 1201 covers the semiconductor structure, except for the regions where medium voltage logic transistors will be formed. Photoresist mask 1201 therefore exposes the region where medium voltage transistor 220 is to be formed.

A P-type impurity, such as boron, is implanted into the regions exposed through photoresist mask 1201 to adjust the threshold voltage of the medium voltage transistors. The medium voltage threshold implant is illustrated by a dashed line in channel region 221. Note that the region where medium voltage logic transistor 220 is to be formed receives both the medium voltage threshold implant and the high voltage threshold implant. This region is therefore illustrated with two dashed lines.

The regions of top oxide layer 263 exposed through photoresist mask 1201 are removed, and gate dielectric layer 225 is formed in these regions. Gate dielectric layer 225 is typically thermally grown silicon oxide. In one embodiment, the thermal oxidation step is a wet oxidization process performed at 800° C. Gate dielectric layer 225 can have a thickness of about 50 to 70 Angstroms.

Photoresist mask 1201 is stripped, and the above-described process of FIG. 12 is repeated with another photoresist mask that exposes the locations where the low voltage transistors are to be formed. Another threshold voltage implant is performed for the low voltage transistors. A thinner gate dielectric layer is then formed for the low voltage transistors.

Figure 13:
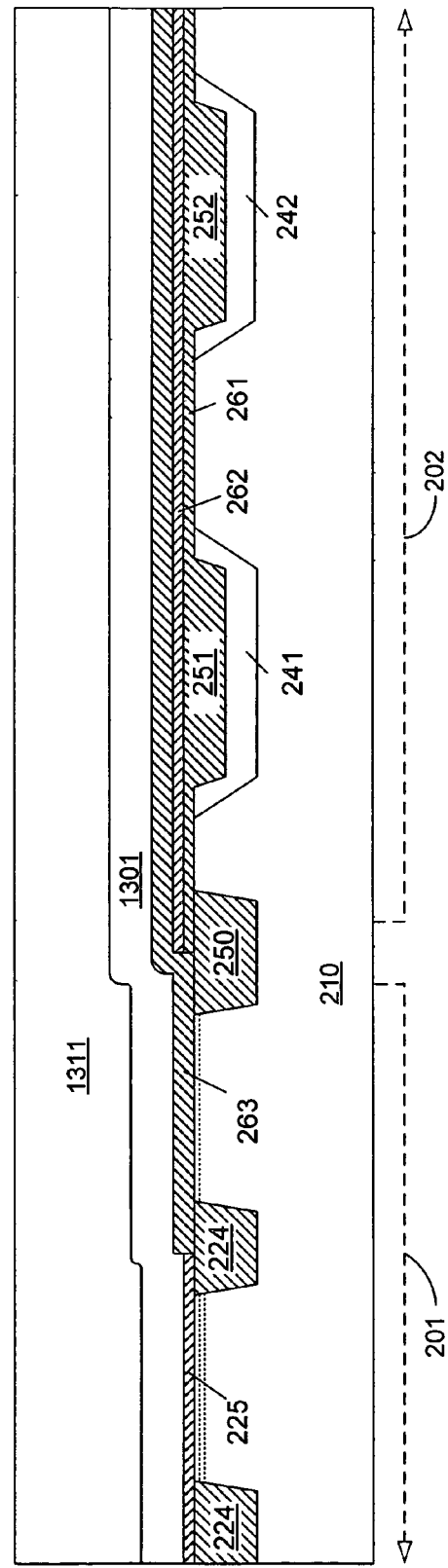

As illustrated in FIG. 13, a blanket layer of polysilicon 1301 is then deposited over the upper surface of the resulting structure. In some embodiments,-phosphorus oxychloride ($POCl_3$) is used to dope-polysilicon layer 1301 to increase the conductivity of polysilicon layer 1301. Other embodiments may implant impurities such as phosphorus ions to increase the conductivity of polysilicon layer 1301.

Figure 14:
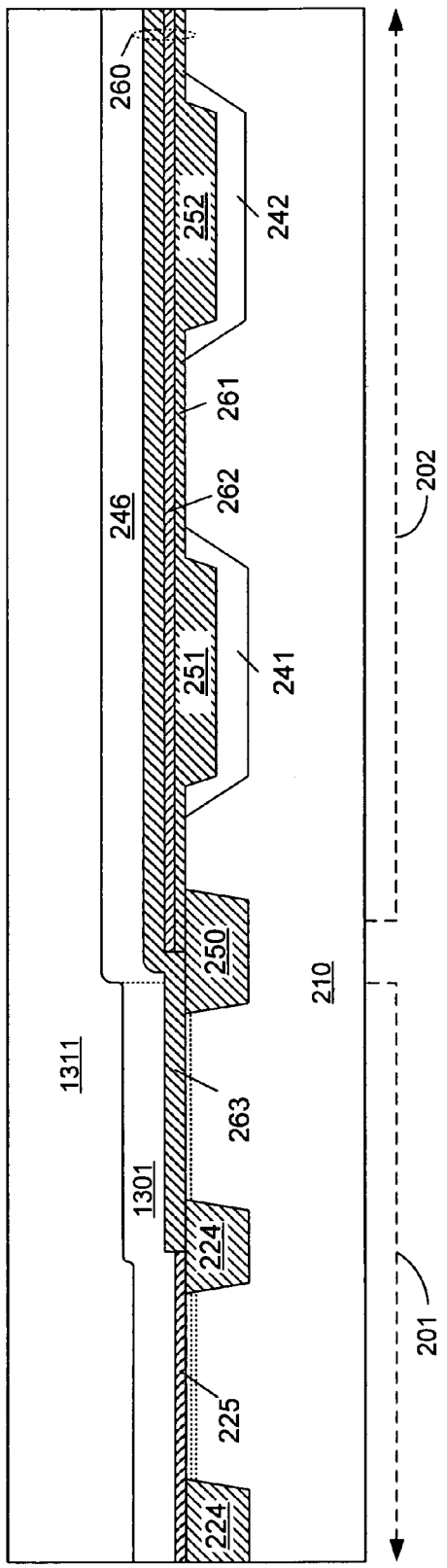

A photoresist mask 1311 is then formed over polysilicon layer 1301. Photoresist mask 1311 covers the first region 201 and the portions of the second region 202 where the word lines (e.g., word lines 248 and 348, FIG. 3) are to be formed. The regions between the word lines (not shown in FIG. 13) are exposed by photoresist mask 1311. As shown in FIG. 14, an etch is performed through photoresist mask 1311, thereby removing the exposed portions of polysilicon layer 1301 to form the polysilicon sections (e.g., polysilicon sections 246 and 346, FIG. 3) of the word lines.

The exposed portions of top oxide layer 263 and silicon nitride layer 262 (located between the word lines) may optionally be removed through the openings of photoresist mask 1311 at this time. Removing these portions of silicon nitride layer 262 helps to minimize unintended charging of ONO structure 260. A first inter-layer dielectric (D1) having an amorphous silicon ultra-violet (UV) absorbing composition can also help minimize unintended charging of ONO structure 260.

Gap filling dielectric (not shown) is then formed between the polysilicon sections. The gap filling dielectric, which can be silicon oxide, closes the spaces between the polysilicon sections (such that the sidewalls of the polysilicon sections and active regions between the word lines are protected during the subsequent salicidation step (described below). The gap filling dielectric is thereby located over portions of ONO structure 260.

Figure 15:
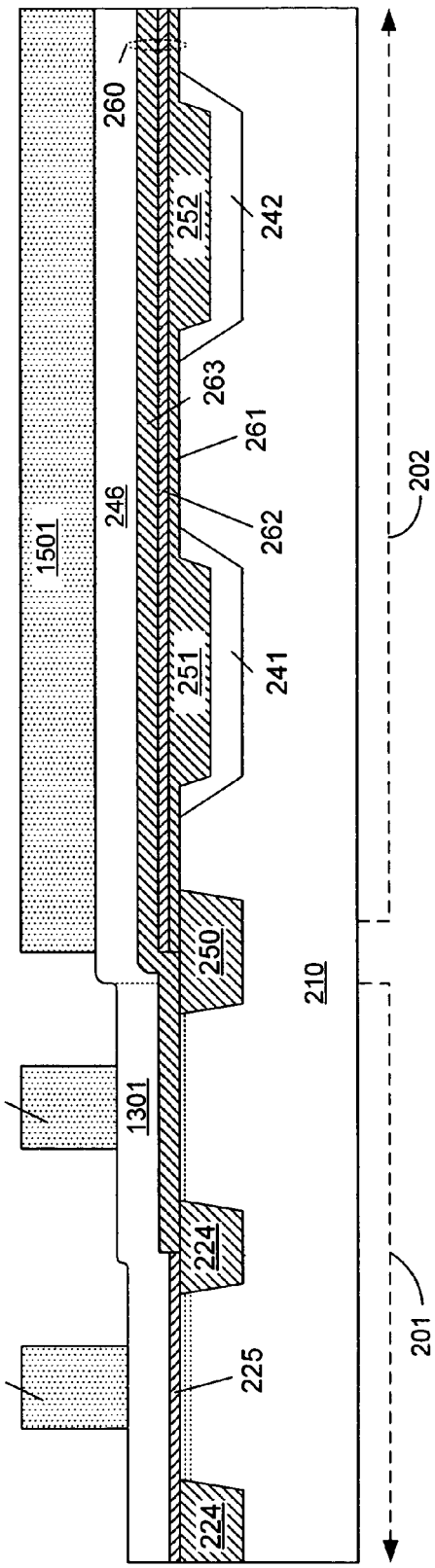

Turning now to FIG. 15, photoresist mask 1311 is stripped, and another photoresist mask 1501 is formed over the resulting structure. Photoresist mask 1501 covers the fieldless array of second region 202 and the portions of the first region 201 where polysilicon structures are to be formed. As illustrated in FIG. 16, an etch is performed through the openings of photoresist mask 1501, thereby forming polysilicon gate electrodes 226 and 236.

Processing continues in accordance with conventional CMOS processing techniques, thereby forming lightly doped source/drain regions for the low voltage, medium voltage and high voltage transistors. For example, lightly doped n-type regions 222A-223A and 232A-233A are formed as shown in FIG. 17. The masking and implantation steps (not shown) required to form the lightly doped source/drain regions 222A-223A and 232A-233A are well known to those of ordinary skill in CMOS processing.

As illustrated in FIG. 18, dielectric spacers 229, 239 and 249 are formed adjacent to polysilicon gate electrodes 226 and 236 and adjacent to the ends of polysilicon word line section 246. Heavily doped source/drain regions are then formed for the low voltage, medium voltage and high voltage transistors. For example, heavily doped n-type regions 222B-223B and 232B-233B are formed as shown in FIG. 18. The masking and implantation steps (not shown) required to form the heavily doped source/drain regions are well known to those of ordinary skill in CMOS processing.

As shown in FIG. 19, the exposed gate oxide regions are stripped, and a refractory metal 1901, such as titanium or cobalt, is formed over the upper surface of the resulting structure. An anneal is performed, thereby reacting the refractory metal layer 1901 with underlying silicon regions. The anneal step also activates the impurities in the implanted regions 222A-223A, 222B-223B, 232A-233A and 232B-233B, thereby forming source/drain regions 222-223 and 232-233.

The unreacted portions of refractory metal layer 1901 are then removed, thereby leaving the metal salicide regions 227, 237, 247, 257, 267, 277 and 287 shown in FIG. 2. The formation of metal salicide is well known to those of ordinary skill in CMOS processing.

Additional CMOS processing steps are then performed, including (but not limited to): forming a silicon nitride liner layer over the resulting structure, depositing a BPSG dielectric layer over the silicon nitride liner layer, forming an ultra-violet absorbing layer over the BPSG layer, and forming contact openings.

In the above-described manner, high voltage CMOS logic transistors, medium voltage CMOS logic transistors, low voltage CMOS logic transistors and fieldless array transistors can be fabricated on a single wafer using an efficient semiconductor process. It is noted that complementary p-channel transistors, whose fabrication has not been described in detail, are also formed on substrate 210 in a manner consistent with the above-described process.

The various embodiments of the structures and methods of this invention that are described above are illustrative only of the principles of this invention and are not intended to limit the scope of the invention to the particular embodiments described. For example, although top oxide layer 263 was described as silicon oxide, it is understood that other high-dielectric materials, such as $Al_2O_3$ for HfSiO, may be used in other embodiments. In view of this disclosure, those skilled in the-art can define other transistor types, floating gate structures, fieldless arrays, logic transistors, silicides, refractory metals, impurities, implantation voltages, implantation angles, dielectrics, floating gates, and so forth, and use these alternative features to create a method, semiconductor device, or integrated circuit according to the principles of this invention. Thus, the invention is limited only by the following claims.

We claim:

1. A method for making an embedded semiconductor memory device comprising:
    forming one or more diffusion bit line regions in a semiconductor substrate; then
    thermally oxidizing the upper surface of the semiconductor substrate, thereby forming a bottom oxide layer over the upper surface of the semiconductor substrate and simultaneously forming bit line oxide regions over each of the one or more diffusion bit line regions; and then
    forming an intermediate dielectric layer over the bottom oxide layer and the bit line oxide regions; and
    implanting CMOS well regions through the intermediate dielectric layer and the bottom oxide layer in a first region of the semiconductor substrate.

2. The method of claim 1, further comprising:
    removing the intermediate dielectric layer and the bottom oxide layer in the first region of the semiconductor substrate; and then
    depositing a top dielectric layer over the intermediate dielectric layer and the first region of the semiconductor substrate using a chemical vapor deposition process.

3. The method of claim 2, further comprising fabricating one or more high-voltage transistors in the first region of the semiconductor substrate, wherein the high-voltage transistors use the top dielectric layer as a gate dielectric layer.

4. The method of claim 2, further comprising forming a sacrificial oxide layer over the first region of the semiconductor substrate after removing the intermediate dielectric layer and the bottom oxide layer, but before depositing the top dielectric layer.

5. The method of claim 3, further comprising fabricating one or more low-voltage transistors in the first region of the semiconductor substrate, wherein each of the low voltage logic transistors have a gate dielectric layer thinner than the top dielectric layer.

6. A method for making an embedded semiconductor memory device comprising:
    forming one or more diffusion bit line regions in a semiconductor substrate; then
    thermally oxidizing the upper surface of the semiconductor substrate, thereby forming a bottom oxide layer over the upper surface of the semiconductor substrate and simultaneously forming bit line oxide regions over each of the one or more diffusion bit line regions; then
    forming an intermediate dielectric layer over the bottom oxide layer and the bit line oxide regions
    depositing a top dielectric layer over the intermediate dielectric layer;
    forming a conductive layer over the top dielectric layer;
    patterning the conductive layer to define a plurality of word lines that extend over the bit line oxide regions and the bottom oxide layer; and
    removing the top dielectric layer and intermediate dielectric layer located between the plurality of word lines.

* * * * *